United States Patent [19]

Jun

[11] Patent Number: 5,480,824
[45] Date of Patent: Jan. 2, 1996

[54] SEMICONDUCTOR MEMORY CELL CAPACITOR AND FABRICATION METHOD THEREOF

[75] Inventor: Young-Kwon Jun, Seoul, Rep. of Korea

[73] Assignee: Goldstar Electron Co., Ltd., Cheongju, Rep. of Korea

[21] Appl. No.: 79,186

[22] Filed: Jun. 18, 1993

[30] Foreign Application Priority Data

Jun. 18, 1992 [KR] Rep. of Korea ................. 92-10546

[51] Int. Cl.⁶ ........................... H01L 21/70
[52] U.S. Cl. .................... 437/52; 437/47; 437/60; 437/919
[58] Field of Search ............. 365/149; 257/306, 257/308, 307; 437/47, 48, 52, 60, 919

[56] References Cited

U.S. PATENT DOCUMENTS

| | | | |
|---|---|---|---|
| 5,047,817 | 9/1991 | Wakamiya et al. | 257/307 |
| 5,150,276 | 2/1992 | Gonzalez et al. | 437/52 |
| 5,164,337 | 11/1992 | Ogawa et al. | 257/308 |
| 5,206,787 | 4/1993 | Fujioka | 257/307 |
| 5,217,914 | 6/1993 | Matsumoto | 437/52 |
| 5,223,729 | 6/1993 | Kudoh et al. | 257/308 |
| 5,247,196 | 9/1993 | Kimura | 257/308 |
| 5,262,662 | 11/1993 | Gonzalez et al. | 257/308 |
| 5,262,663 | 11/1993 | Rho et al. | 257/308 |
| 5,266,512 | 11/1993 | Kirsch | 437/60 |
| 5,274,258 | 12/1993 | Ahn | 365/149 |

FOREIGN PATENT DOCUMENTS

| | | | |
|---|---|---|---|
| 318277 | 5/1989 | European Pat. Off. | 257/308 |
| 59-23851 | 12/1984 | Japan | 257/308 |
| 0091957 | 4/1991 | Japan . | |
| 4-25169 | 1/1992 | Japan | 257/308 |

OTHER PUBLICATIONS

Yoshimaru et al., "Rugged Surface Poly–Si Electrode and Low Temperature Deposited $Si_3N_4$ for 64MBit and Beyond STC DRAM Cell," IEDM 1990 pp. 659–662.

Jun et al. "The Fabrication and Electrical Properties of Modulated Stacked Capacitor for Advanced DRAM Applications," IEEE Electron Device Letters, vol. 13, No. 8 Aug. 1992.

"Stacked Capacitor DRAM Cell with Vertical Fins (VF–STC)," IBM Tech. Discl. Bull., vol. 33 #2, Jul. 1990, pp. 245–247.

*Primary Examiner*—Tom Thomas
*Attorney, Agent, or Firm*—Alan R. Loudermilk

[57] ABSTRACT

A capacitor of a semiconductor memory cell having a maximized capacitance and a process for formation thereof are disclosed. The process is characterized in that a projected portion or a depressed portion is formed. Sets of polysilicon layers and silicon oxide layers are stacked over the projected or depressed portion. The sets of stacked layers are etched back, so that the layers having a slower etch rate remain in the form of multi-layer rims. An underlying silicon oxide layer is etched using the multi-layer rims as a mask to form a multi-layer cylinder. Then a polysilicon layer is deposited and etched back deeper than the thickness of the polysilicon layer. The silicon oxide layer is subjected to a wet etch to form a multi-layer cylindrical storage electrode. Then a dielectric layer and cell plate are formed on the storage electrode.

8 Claims, 5 Drawing Sheets

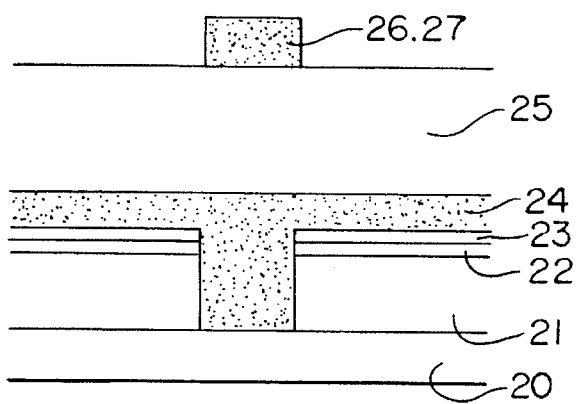
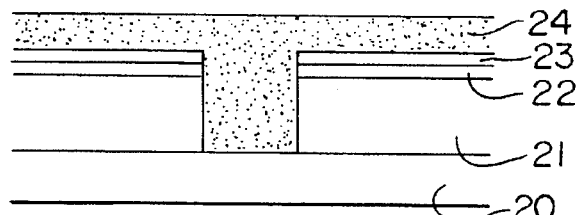
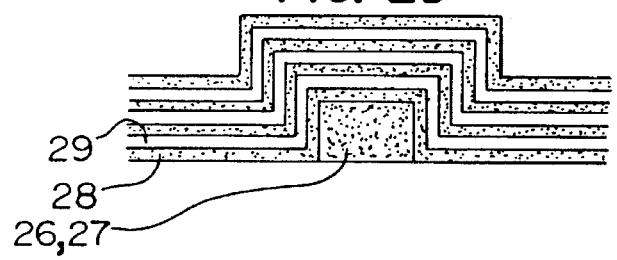
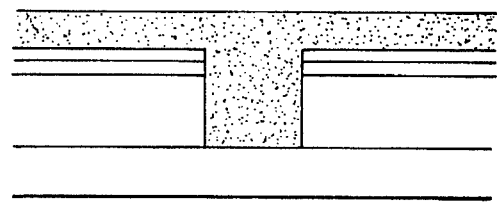
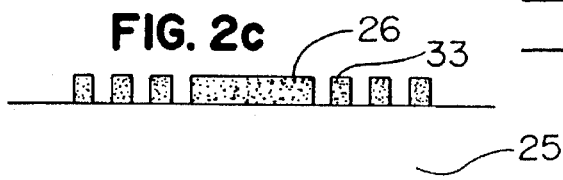
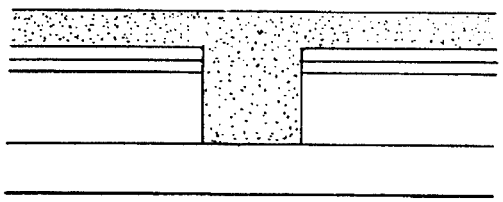
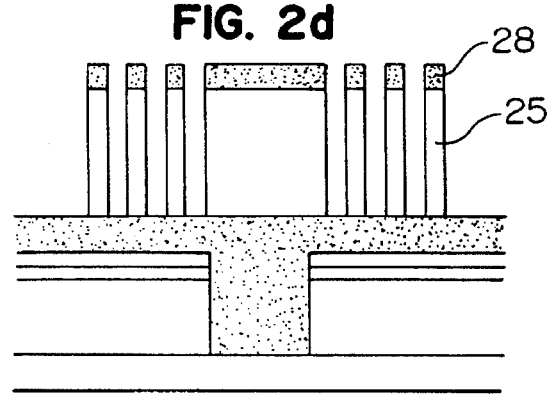

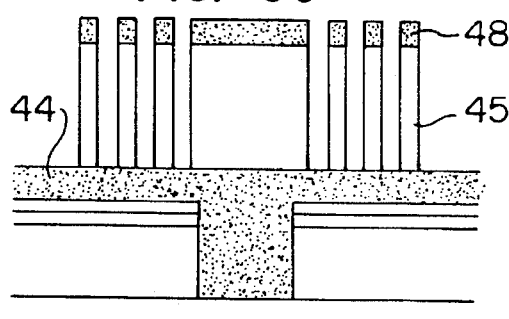
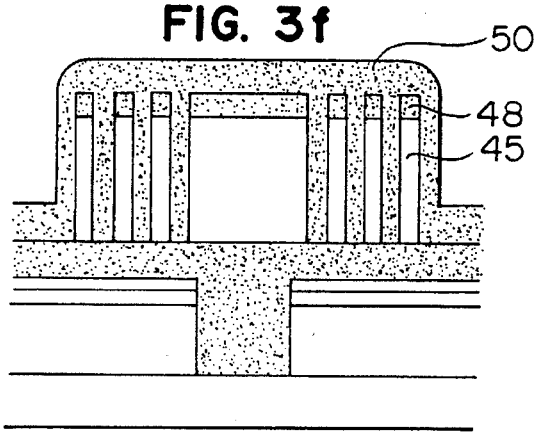
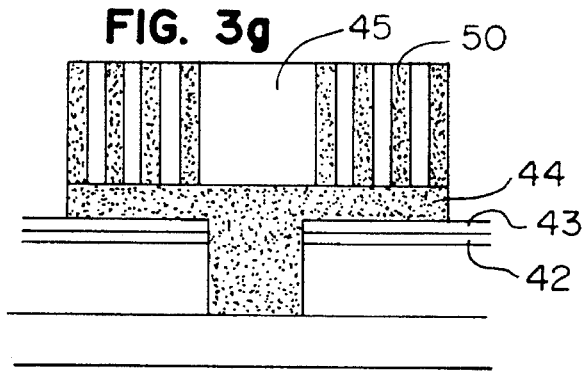
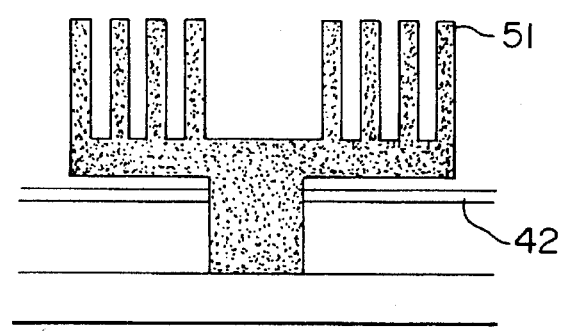

SEMICONDUCTOR MEMORY CELL CAPACITOR AND FABRICATION METHOD THEREOF

FIELD OF THE INVENTION

The present invention relates to methods for forming a capacitor of a semiconductor device, and more particularly to processes for fabrication of a capacitor of a semiconductor device in which the storage electrode of thee capacitor is formed in the shape of a multi-layer (such as triple or more) by a self-aligning method, thereby maximizing the capacitance of the memory capacitor, and ultimately contributing to the high density of memory cells in the semiconductor device.

BACKGROUND OF THE INVENTION

Generally, a ring shaped stacked capacitor cell is manufactured as shown in FIG. 1 and as described hereinafter. Silicon oxide layer 2 and silicon nitride layer 3 are successively deposited upon silicon substrate 1, and a contact hole is opened by a photo-etching process (FIG. 1(a)). Then as shown in FIG. 1(b), polysilicon layer 4 is deposited upon silicon nitride layer 3, and then another silicon oxide layer 5 is deposited thereon. Thereafter, silicon oxide layer 5 is patterned to be formed as an etch mask for the etching of polysilicon layer 4, and then polysilicon layer 4 is partially etched using the oxide mask as shown in FIG. 1(c).

Then, as shown in FIG. 1(d), silicon oxide layer 6 is deposited, and then silicon oxide layer 6 is etched back to form silicon oxide side wall 7.

Next, as shown in FIG. 1(e), a polysilicon layer is deposited and etched back to form polysilicon side wall 8 in order to utilize it as a ring shaped capacitor storage electrode.

Then, as shown in FIG. 1(f), silicon oxide layer 5 and side wall 7 are subjected to a wet etch within an HF buffering solution, thereby forming capacitor storage electrode 9. In the above process, silicon nitride layer 3 serves as an etch stop layer in the polysilicon etch process.

Finally, as shown in FIG. 1(g), dielectric layer 10 is formed on storage electrode 9, and cell plate 11 is formed on dielectric layer 10, thereby completing the process for forming the capacitor.

In the above described conventional capacitor forming process, it is very difficult to etch the polysilicon layer partially to form a thin polysilicon element of a predetermined thickness as in the step of FIG. 1(c). Further, with the main and ring electrodes, the increase of the capacitance is very limited, thereby making it difficult to form a high density memory cell.

SUMMARY OF THE INVENTION

The present invention is intended to overcome the above described disadvantages of the conventional techniques.

It is an object of the present invention to provide a process for forming a capacitor of a semiconductor device in which the capacitance can be increased with a limited volume by forming the capacitor storage electrode in the form of a multi-layer cylindrical form.

In achieving the above object, the process according to the present invention includes the steps of: depositing a first silicon oxide layer, a first silicon nitride layer and a second silicon oxide layer, successively, and forming a contact hole by patterning these layers at a position where a capacitor storage electrode is to be formed for a buried contact, and depositing a first polysilicon layer, a third silicon oxide layer and a second polysilicon layer to form a projected portion by patterning these layers; stacking sets of third polysilicon layers and fourth silicon oxide layers alternately over the projected portion in multiple layers; etching the multiple layers of the third polysilicon layers and fourth silicon oxide layers such that portions of the third polysilicon layers remain in the form of multiple rims; etching the third silicon oxide layer by using the multiple rims of the third polysilicon layers as a mask to form a multi-layer cylinder; depositing a fourth polysilicon layer, and carrying out an etch back deeper than the thickness of the fourth polysilicon layer; subjecting the third silicon oxide layer to a wet etch to form a multi-layer cylindrical storage electrode; and depositing a dielectric layer and a cell plate upon the storage electrode.

Another way to achieve an object of the invention is by a method that includes the steps of: depositing a first silicon oxide layer, a first silicon nitride layer and a second silicon oxide layer, successively, upon a silicon substrate, and patterning these layers to form a contact hole; depositing a first polysilicon layer, a third silicon oxide layer, a second polysilicon layer and a fourth silicon oxide layer, successively; patterning the fourth silicon oxide layer to form a depressed portion; stacking third polysilicon layers and fifth silicon oxide layers over the depressed portion and the fourth silicon oxide layer in an alternating manner to form a multi-layer structure; etching back the uppermost layer to form a polysilicon plug in the depressed portion; etching back the third polysilicon layers and the fifth silicon oxide layers so that portions of the third polysilicon layers remain in the form of multi-layer rims; etching back the third silicon oxide layer continuously by using the third polysilicon layers as a mask to form a multi-layer cylinder; depositing a fourth polysilicon layer and carrying out an etch back deeper than the thickness of the fourth polysilicon layer; subjecting the third silicon oxide layer to a wet etch to form a multi-layer cylindrical storage electrode; and forming a dielectric layer and a cell plate upon the storage electrode, thereby completing the formation of the capacitor according to the present invention.

It is another object of the present invention to provide a structure of a capacitor of a semiconductor memory cell in which the storage electrode has a multi-layer cylindrical shape having three layers or more.

BRIEF DESCRIPTION OF THE DRAWINGS

The above objects and other advantages of the present invention will become more apparent by describing in detail the preferred embodiments of the present invention with reference to the attached drawings in which:

FIGS. 2(a)–2(g) illustrate a process for formation of a capacitor of a semiconductor device in accordance with one embodiment of the present invention; and FIG. 3(a)–3(h) illustrate a process in accordance with another embodiment of the present invention.

DESCRIPTION OF THE PREFERRED EMBODIMENT

Figure 1A:
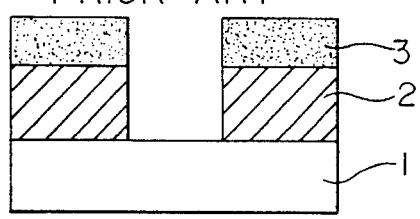
FIGS. 1(a)–1(f) illustrate a process for formation of a capacitor of a conventional semiconductor device.
Figure 1B:
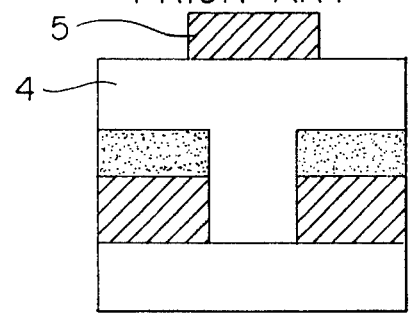
Figure 1C:
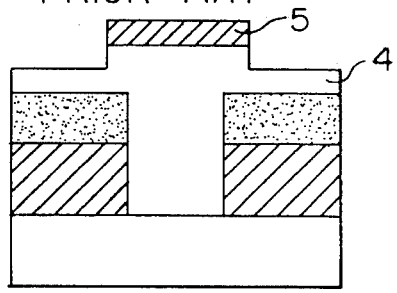
Figure 1D:
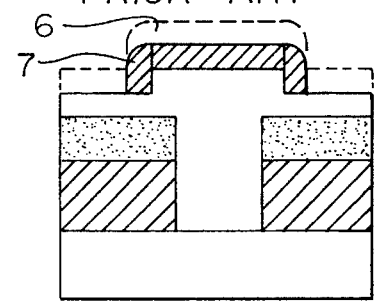
Figure 1E:
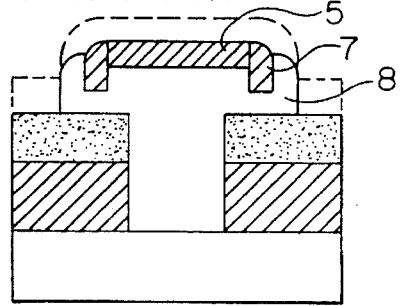
Figure 1F:
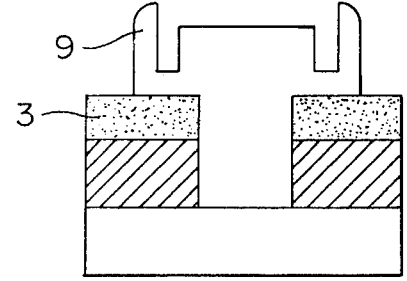
Figure 1G:
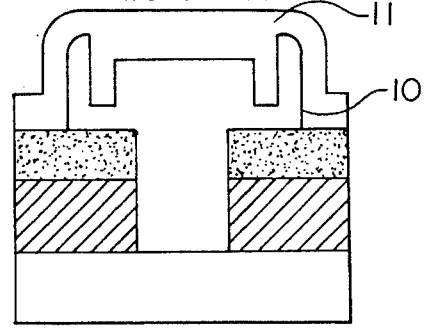

FIG. 2 illustrates an embodiment of a process for forming a capacitor of a semiconductor device according to the present invention.

According this embodiment, the method for fabrication of a semiconductor memory cell capacitor comprises the steps of: (1) forming a first interlayer, a second interlayer and a third interlayer on a conductive substrate in the cited order and forming a capacitor contact hole; (2) depositing a first conductive layer on the overall surface, and a fourth interlayer on the first conductive layer; (3) depositing a second conductive layer, and patterning the second conductive layer to form a projected portion; (4) stacking a plurality of layers comprised of a second conductive layer and fifth interlayer alternately in a multi-layer form over the projected portion; (5) etching back the second conductive layers and fifth interlayers so that portions of the second conductive layers remain in the form of multi-layer rims; (6) etching the fourth interlayer using the multi-layer rims as a mask; (7) depositing a third conductive layer and etching back the third conductive layer, second conductive layer, and first conductive layer; (9) etching the fourth and third interlayers by a wet etching process to form a first storage electrode; and (10) forming a dielectric layer of the first storage electrode and a capacitor plate electrode on the dielectric layer of the first storage electrode.

First, as shown in FIG. 2(a), first silicon oxide layer 21 (first interlayer), first silicon nitride layer 22 (second interlayer) and second silicon oxide layer 23 (third interlayer) are successively deposited upon silicon substrate 20, and then a contact hole is opened by an etching process. First polysilicon layer 24 (first conductive layer) is deposited in the form of doped polysilicon to a thickness of less than 3000 Angstroms by applying a low pressure chemical vapor deposition process (LPCVD). Third silicon oxide layer 25 (fourth interlayer), or an insulation layer such as a silicon nitride layer having a greater etch rate as compared with polysilicon, is deposited to a thickness of less than 5000 Angstroms. Second polysilicon 26 (second conductive layer) is deposited to a thickness of less than 2000 Angstroms, and a patterning process is carried out to form projected portion 27.

After completion of the above steps, as shown in FIG. 2(b), third polysilicon layers 28 (third conductive layers) and fourth silicon oxide layers 29 (fifth interlayers), or insulating layers such as silicon nitride layers having a larger etch rate as compared with polysilicon, are alternately stacked in thicknesses of less than 500 Angstroms in the form of a multi-layer contour. As shown in FIG. 2(c), a gas containing F– ions such as $CF_4$ is used to carry out an etch process in such a manner that third polysilicon layers 28 are etched more slowly than fourth silicon oxide layers 29, and consequently that the polysilicon layers remain in the form of multiple rims 33. As shown in FIG. 2(d), third silicon oxide layer 25 is anisotropically etched by using multi-layer rims 33 as a mask, such that an etch stop is provided by first polysilicon layer 24, thereby forming a multi-layer cylinder around a core pole.

Figure 2E:
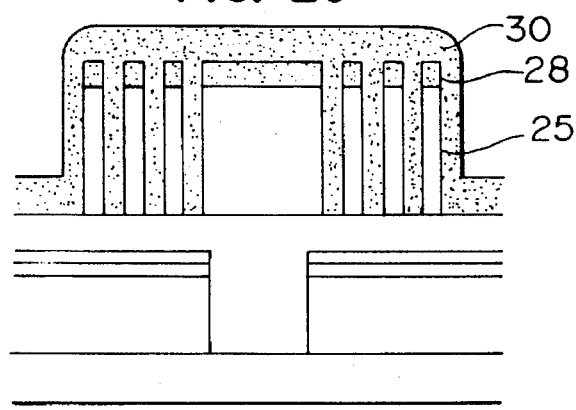
Figure 2F:
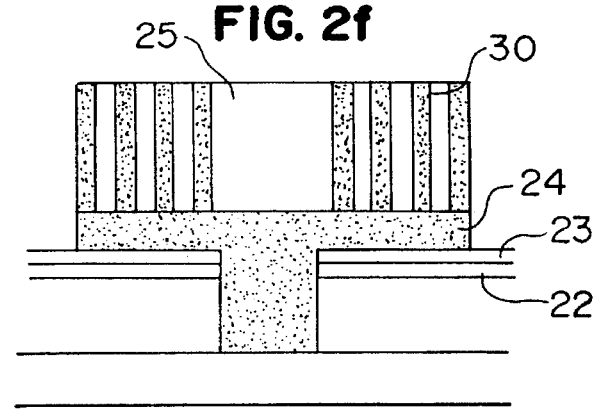

After the above steps, as shown in FIG. 2(e), fourth polysilicon layer 30 (fourth conductive layer) is deposited on the multi-layer cylinder, and, as shown in FIG. 2(f), polysilicon layers 30, 28, 26, 24 are etched back more deeply than the thickness of fourth polysilicon 30. In this etch process, an etch stop is provided by second silicon oxide layer 23, thereby exposing second silicon oxide layer 23.

Figure 2G:
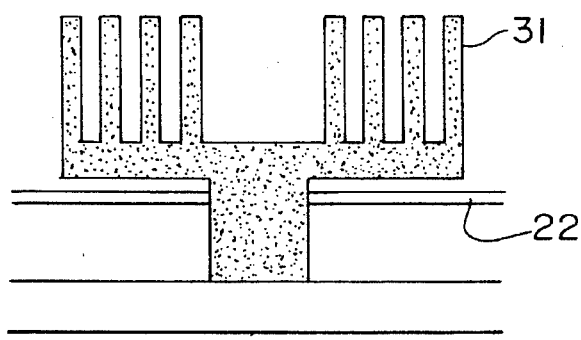

As shown in FIG. 2(g), second and third silicon oxide layers 23 and 25 are subjected to a wet etch within a solution containing HF to remove the two silicon oxide layers, thereby forming a multi-layer cylindrical storage electrode 31. Thereafter, a dielectric layer and a cell plate are deposited upon storage electrode 31 by conventional methods, thereby completing the process for forming a capacitor in accordance with the present invention.

FIG. 3 illustrates another embodiment of a process in accordance with the present invention in which a depression is formed.

According to this embodiment, a method for fabrication of a semiconductor memory cell capacitor comprises the steps of: (1) forming a first interlayer, a second interlayer and a third interlayer on a conductive substrate in the cited order and forming a capacitor contact hole; (2) depositing a first conductive layer on the overall surface, and a fourth interlayer on the first conductive layer; (3) depositing a second conductive layer and fifth interlayer, and patterning the fifth interlayer to form a depressed portion; (4) stacking a plurality of layers comprised of a second conductive layer and sixth interlayer alternately in a multi-layer form over the depressed portion; (5) etching back the second conductive layers, sixth interlayers, and fifth interlayer so that portions of the second conductive layer remain in the form of multi-layer rims; (6) etching the fourth interlayer using the multi-layer rims as a mask; (7) depositing a third conductive layer; (8) etching back the third conductive layer, second conductive layer, and first conductive layer; (9) etching the fourth and third interlayers by a wet etching process to form a first storage electrode; and (10) forming a dielectric layer on the first storage electrode and a capacitor plate electrode on the dielectric layer of the first storage electrode.

Figure 3A:
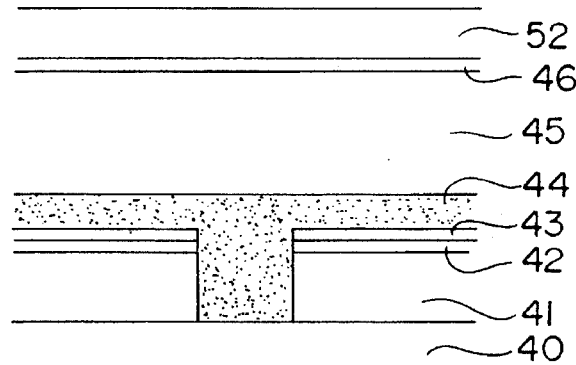

As shown in FIG. 3(a), first silicon oxide layer 41 (first interlayer), first silicon nitride layer 42 (second interlayer) and second silicon oxide layer 43 (third interlayer) are deposited upon silicon substrate 40 at a portion where a memory cell transistor (not shown) is formed. A contact hole is opened by an photo-etching process. First polysilicon layer 44 (first conductive layer) is deposited to a thickness of less than 3000 Angstroms by application of a conventional low pressure chemical vapor deposition process. Third silicon oxide layer 45 (fourth interlayer) is deposited to a thickness of less than 5000 Angstroms. Second polysilicon layer 46 (second conductive layer) is deposited to a thickness of less than 1000 Angstroms. Fourth silicon oxide layer 52 (fifth interlayer) is deposited to a thickness of less than 2000 Angstroms.

Figure 3B:
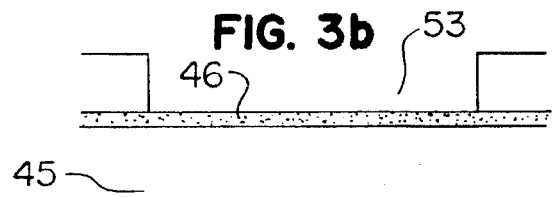
Figure 3C:
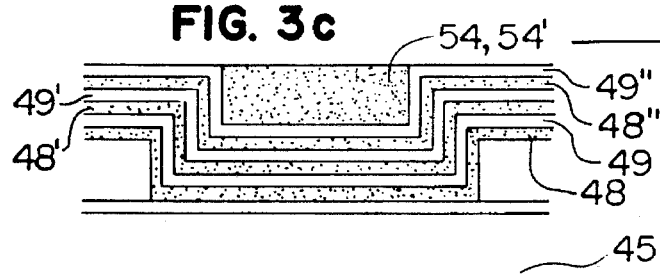

Next as shown in FIG. 3(b), fourth silicon oxide layer 52 is patterned to form a depressed portion 53. As shown in FIG. 3(c), third polysilicon layers 48, 48' and 48" (third conductive layers) and fifth silicon oxide layers 49, 49' and 49" (sixth interlayers) are stacked in an alternate manner to a thickness of 2000–5000 Angstroms, and then uppermost polysilicon layer 54 is deposited. Uppermost polysilicon layer 54 is etched back by using $O_2$ and $CF_4$ gases, thereby forming polysilicon plug 54'.

Figure 3D:
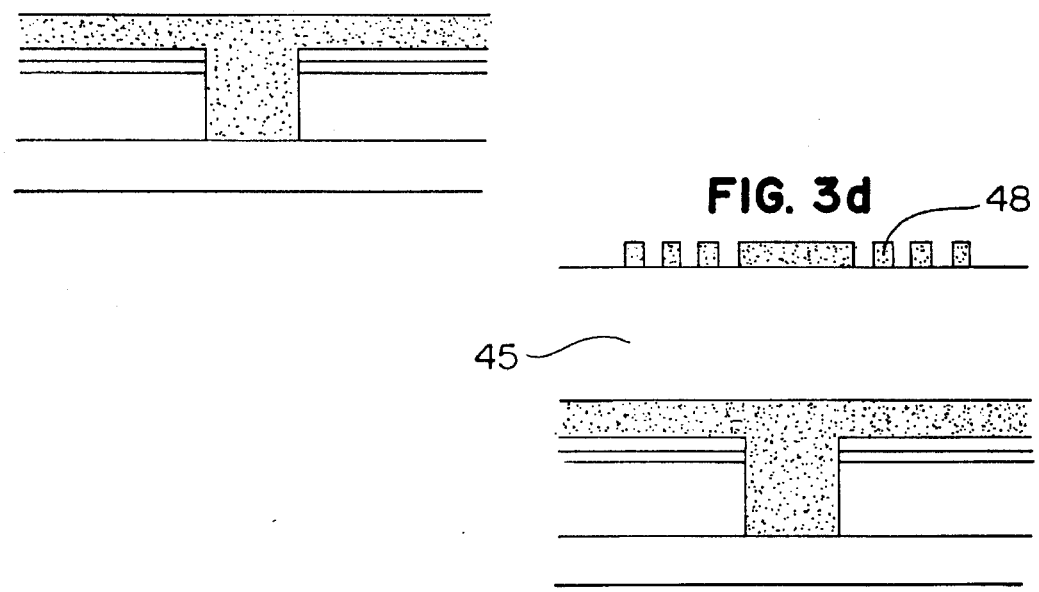

Then as shown in FIG. 3(d), a $CF_4$ gas containing F– ions is used to etch back the stacked multi-layers of the third polysilicon layers and the fifth silicon oxide layers. Under this condition, an adjustment is made in such a manner that the etch rate of the third polysilicon layers is slower than that of the fifth silicon oxide layers, and consequently the third polysilicon layers remain in the form of multi-layer rims. That is, the stepped portions of the third polysilicon layer where the thickness is larger will selectively remain as shown.

As shown in FIG. 3(e), third silicon oxide layer 45 is etched using the multi-layer rims as a mask. In this etch process, first polysilicon layer 44 serves as an etch stop layer, thereby forming a core pole and a multi-layer cylinder surrounding the core pole.

As shown in FIG. 3(f), fourth polysilicon layer 50 (fourth conductive layer) is deposited on the multi-layer cylinder, and then, as shown in FIG. 3(g), fourth polysilicon layer 50 is etched back deeper than its thickness with second silicon oxide layer 43 serving as an etch stop layer, thereby exposing the surface of second silicon oxide layer 43.

As shown in FIG. 3(h), second and third silicon oxide layers 43 and 45 are subjected to a wet etch within a solution containing HF, thereby removing them, and forming multi-layer cylindrical storage electrode 51.

Then a dielectric layer and a cell plate of the capacitor are formed on storage electrode 51, thereby completing the formation of a capacitor in accordance with the present invention.

According to the present invention as described above, a projected portion or a depressed portion is formed, and several sets of two layers having different etch rates and composed of different materials are alternately stacked. Then the sets of layers are etched back, so that the material having a slower etch rate may remain in the form of multi-layer rims. By using the residue layers as a mask, a lower-disposed layer having a etch rate different from that of the residue layers is etched, so that the etched lower layer forms a multi-layer cylindrical structure, and that the storage electrode is made to have the form of a multi-layer cylinder having more than three layers by a self-aligning method.

Thus, the capacitance of the memory capacitor can be increased, thereby contributing to the high density of the semiconductor device.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for fabricating a capacitor of a semiconductor memory cell, comprising the steps of:
   (1) forming a first insulating layer on a substrate, forming a second insulating layer on the first insulating layer, forming a third insulating layer on the second insulating layer, and forming a capacitor contact hole to the substrate through the first, second and third insulating layers;
   (2) forming a first conductive layer on the third insulating layer and in the capacitor contact hole, and forming a fourth insulating layer on the first conductive layer;
   (3) forming a second conductive layer on the fourth insulating layer, and patterning the second conductive layer to form a projected portion of the second conductive layer on the fourth insulating layer;
   (4) forming a plurality of stacked layers, the plurality of stacked layers con, rising third conductive layers and interlayers alternately formed in a multi-layer form on the fourth insulating layer and over the projected portion of the second conductive layer, wherein the interlayers comprise a material have a higher etch rate than the material of the third conductive layers;
   (5) etching the third conductive layers and the interlayers so that portions of the third conductive layers remain in the form of multi-layer rims on the fourth insulating layer;
   (6) etching the fourth insulating layer using the multi-layer rims as a mask, wherein a multi-layer cylinder is formed, the multi-layer cylinder comprising projections of the fourth insulating layer under the multi-layer rims;
   (7) forming a fourth conductive layer on the first conductive layer, on the multi-layer rims of the second conductive layer, and between the projections of the fourth insulating layer;
   (8) etching the fourth conductive layer, third conductive layer, and first conductive layer, wherein projections of the fourth conductive layer are formed between the projections of the fourth insulating layer;
   (9) etching the fourth insulating layer and the third insulating layer by a wet etching process to form a first storage electrode; and
   (10) forming a dielectric layer on the first storage electrode and a capacitor plate electrode on the dielectric layer.

2. The method as claimed in claim 1, wherein the first, second, third and fourth conductive layers con, rise polysilicon, and the first, third and fourth insulating layers and the interlayers comprise silicon dioxide, and the second insulating layer comprises silicon nitride.

3. A method for fabricating a capacitor of a semiconductor memory cell, comprising the steps of:
   (1) forming a first insulating layer on a conductive substrate, a second insulating layer on the first insulating layer and a third insulating layer on the second insulating layer, and forming a capacitor contact hole to the substrate through the first, second and third insulating layers;
   (2) forming a first conductive layer on the third insulating layer and in the capacitor contact hole, and forming a fourth insulating layer on the first conductive layer;
   (3) forming a second conductive layer on the fourth insulating layer and a fifth insulating layer on the second conductive layer, and patterning the fifth interlayer to form a depressed portion of the fifth insulating layer on the second conductive layer;
   (4) forming a plurality of stacked layers, the plurality of stacked layers comprising third conductive layers and interlayers alternately formed in a multi-layer form over the depressed portion, wherein the underlayers comprise a material have a higher etch rate than the material of the second and third conductive layers;
   (5) etching the third conductive layers, the interlayers, and the fifth insulating layer so that portions of the second conductive layer remain in the form of multi-layer rims on the fourth insulating layer;
   (6) etching the fourth insulating layer using the multi-layer rims as a mask, wherein a multi-layer cylinder is formed, the multi-layer cylinder comprising projections of the fourth insulating layer under the multi-layer rims;
   (7) forming a fourth conductive layer on the first conductive layer, on the multi-layer rims of the second conductive layer, and between the projections of the fourth insulating layer;
   (8) etching the fourth conductive layer, the second conductive layer, and the first conductive layer, wherein projections of the fourth conductive layer are formed between the projections of the fourth insulating layer;
   (9) etching the fourth and third insulating layers by a wet etching process to form a first storage electrode; and
   (10) forming a dielectric layer on the first storage electrode and a capacitor plate electrode on the dielectric layer.

4. The method as claimed in claim 3, wherein the first, second, third and fourth conductive layers comprise polysilicon, and the first, third, fourth and fifth insulating layers and the interlayers con, rise silicon dioxide, and the second insulating layer comprises silicon nitride.

5. A method for fabricating a capacitor of a semiconductor memory cell, comprising the steps of:

(1) forming a first silicon oxide layer on a silicon substrate on which circuit elements of the memory cell are formed, a first silicon nitride layer on the first silicon oxide layer and a second silicon oxide layer on the first silicon nitride layer, and opening a capacitor contact hole to the substrate in the first silicon oxide layer, the first silicon nitride layer and the second silicon oxide layer by an etching process on a portion of the substrate where the capacitor is to be formed;

(2) forming a first polysilicon layer in the contact hole and on the second silicon oxide layer, forming a third silicon oxide layer on the first polysilicon layer and a second polysilicon layer on the third silicon oxide layer, and patterning the second polysilicon layer to form a projected portion of the second polysilicon on the third silicon oxide layer;

(3) forming a plurality of stacked layers, the plurality of stacked layers comprising third polysilicon layers and fourth silicon projected portion, wherein the fourth silicon oxide layers have a oxide layers alternately formed in a multi-layer form over the higher etch rate than the third polysilicon layers;

(4) etching the third and second polysilicon layers and the fourth silicon oxide layers so that portions of the third and second polysilicon layers remain in the form of multi-layer rime on the third silicon oxide layer;

(5) etching the third silicon oxide layer using the multi-layer rims as a mask to form a multi-layer cylinder, the multi-layer cylinder comprising projections of the third silicon oxide layer under the multi-layer rims;

(6) forming a fourth polysilicon layer on the first polysilicon layer, on the multi-layer rims of the second polysilicon layer, and between the projections of the third silicon oxide layer, and etching the fourth, third, second, and first polysilicon layers, wherein projections of the fourth polysilicon layer are formed between the projections of the third silicon oxide layer;

(7) wet etching the third and second silicon oxide layers to form a multi-layer cylindrical storage electrode; and (8) forming a dielectric layer and cell plate of the capacitor.

6. The method as claimed in claim 5, wherein at step (3), a plurality of layers having different etch rates and comprised of different materials are deposited in lieu of the third polysilicon layers and the fourth silicon oxide layers.

7. The method as claimed in claim 6, wherein, at step (4), the multi-layer rims are formed by etching a plurality of different material layers by using a gas containing F– ions.

8. A method for fabricating a capacitor of a semiconductor memory cell, comprising the steps of:

(1) forming a first silicon oxide layer on a silicon substrate on which circuit elements of the memory cell are formed, a first silicon nitride layer on the first silicon oxide layer and a second silicon oxide layer on the first silicon nitride layer, and opening a capacitor contact hole to the substrate in the first silicon oxide layer, the first silicon nitride layer and the second silicon oxide layer by an etching process on a portion of the substrate where the capacitor is to be formed;

(2) forming a first polysilicon layer in the contact hole and on the second silicon oxide layer, forming a third silicon oxide layer on the first polysilicon layer, a second polysilicon layer on the third silicon oxide layer, and a fourth silicon oxide layer on the second polysilicon layer, and patterning the fourth silicon oxide layer to form a depressed portion of the fourth silicon oxide layer on the second polysilicon layer;

(3) forming a plurality of stacked layers on the fourth silicon oxide layer and on the depressed portion, the plurality of stacked layers con, rising third polysilicon layers and fifth silicon oxide layers alternately formed in a multi-layer form over the depressed portion, and forming a plug polysilicon layer above the depressed portion and etching back the plug polysilicon layer so as to form a polysilicon plug on the stacked layers within the depressed portion;

(4) etching the third polysilicon layers and fifth silicon oxide layers so that portions of the second polysilicon layers remain in the form of multi-layer rims on the third silicon oxide layer;

(5) etching the third silicon oxide layer using the multi-layer rims as a mask to form a multi-layer cylinder, the multi-layer cylinder comprising projections of the third silicon oxide layer under the multi-layer rims;

(6) forming a fourth polysilicon layer on the first polysilicon layer, on the multi-layer rims of the second polysilicon layer, and between the projections of the third silicon oxide layer, and etching the fourth, third, second, and first polysilicon layers, wherein projections of the fourth polysilicon layer are formed between the projections of the third silicon oxide layer;

(7) wet etching the third and second silicon oxide layers to form a multi-layer cylindrical storage electrode; and (8) forming a dielectric layer and cell plate of the capacitor.

* * * * *